United States Patent [19]

Mayumi

[11] 4,267,463

[45] May 12, 1981

[54] DIGITAL INTEGRATED CIRCUIT

[75] Inventor: Hiroshi Mayumi, Tokyo, Japan

[73] Assignee: Nippon Electric Co., Ltd., Tokyo, Japan

[21] Appl. No.: 969,891

[22] Filed: Dec. 15, 1978

[30] Foreign Application Priority Data

Dec. 15, 1977 [JP] Japan ................................. 52-151307

[51] Int. Cl.$^3$ ............................................ H03K 19/20
[52] U.S. Cl. ................................... 307/445; 307/465;
324/73 R; 371/24
[58] Field of Search ............... 307/207, 208, 213, 303,
307/203; 324/73 R; 371/16, 17, 20, 24, 25, 27,
48, 57, 60

[56] References Cited

U.S. PATENT DOCUMENTS 3,818,202   6/1974   Ellison ............................ 307/207 X

*Primary Examiner*—John Zazworsky
*Attorney, Agent, or Firm*—Sughrue, Rothwell, Mion, Zinn and Macpeak

[57] ABSTRACT

A digital integrated circuit is provided with a maximum number of input and output terminals assigned for a normal operation mode and the number of terminals required for a function test is minimized. The integrated circuit is additionally provided with at least one control terminal, the functions of at least a part of the input and output terminals being determined in response to the logical level at the control terminal. Terminal utilization efficiency is further enhanced if the control terminal is connected to an inverter which is nonresponsive to the normal logic mode voltage range but which is responsive to a voltage outside the normal logic mode voltage range.

15 Claims, 5 Drawing Figures

DIGITAL INTEGRATED CIRCUIT

BACKGROUND OF THE INVENTION

The present invention relates to a digital logic circuit, and more particularly, to a digital logic circuit to be realized as a monolithic integrated circuit.

As is well known, accompanying progress in large scale integrated circuit (hereinafter referred to as LSI) of digital logic circuits, the number of internal nodes therein has been greatly increased, and especially where the circuit contains memory elements (flip-flops or the like), the entire testing of such LSI has become extremely difficult.

For overcoming this difficulty, a method, so-called scan-path method for simplifying the test by converting a general sequential logic circuit comprised in the circuit into a combinational logic circuit has been known, in which flip-flops are arranged at particular portions within a logic circuit to divide them into a number of groups so that each flip-flop group may be independently operated as a shift register upon a test operation mode which is different from a normal operation mode, and at any arbitrary time point the state of any arbitrary flip-flop can be read or rewritten by connecting test terminals to the clock input, data input, data output, etc. of the flip-flop group. While this method is surely very effective for simplifying the method for testing an LSI, its shortcoming exists in that test input and output terminals therefore are greatly increased in number. Though this shortcoming is not remarkable in the case where a large scale logic circuit is constructed according to the conventional system which uses as a basic unit a printed circuit card having integrated circuits of small scale integration mounted thereon and having a large number of connector terminals, it is becoming extremely disadvantageous at present because, accompanying the increase of a degree of integration of integrated circuit, there remains no margin for additional terminals.

SUMMARY OF THE INVENTION

Therefore, it is one object of the present invention to provide a digital integrated circuit which is additionally provided the function of checking or the like without increasing the number of terminals.

Another object of the present invention is to provide a digital integrated circuit in which a maximum number of input and output terminals are assigned for a normal operation mode that is an inherent purpose of use of the circuit and the number of terminals required for a function test is minimized.

A digital integrated circuit, especially a monolithic integrated circuit according to the present invention, is characterized in that an integrated circuit is provided with, in addition to a plurality of input and output terminals, at least one control terminal, and functions of at least a part of the input and output terminals are determined in response to the logical level at the control terminal.

The present invention is based on the recognition that even with physically n input (output) terminals, they can function as 2n terminals if different functions are assigned to each terminal depending upon a logical state of another control terminal, for instance, depending upon whether it is "1" or "0". Of course, provision must be made in the assignment such that among the 2n functions, the former n functions may not be used simultaneously with the latter n functions. This principle can be easily extended to the case of m control inputs. Furthermore, the present invention is based on the recognition that if the so-called third value in a voltage value region other than the normal logical voltage region (for instance, $-0.5$ V $\sim +5.5$ V in the case of TTL) is used (for instance, an inverter input terminal operating at a threshold value of $+8$ V is connected in parallel to a normal TTL terminal) and this third value is employed as the mode control input, that is, if a normal logic mode is realized at $-0.5$ V $\sim +5.5$ V and a third mode is realized at 8 V or higher, then the terminal efficiency can be further enhanced.

According to one feature of the present invention, there is provided a monolithic digital integrated circuit including a plurality of input terminals, a plurality of output terminals, and at least one mode control input terminal, which circuit has one or more operation modes corresponding to the control terminal, and in which at least a part of the input and output terminals are controlled by the mode control input terminal so that they may achieve different functions in the different operation modes.

According to another feature of the present invention, there is provided the above-featured digital integrated circuit, in which at least a part of the input (output) terminals also physically serve as control terminals, such that in a normal logical voltage value region they may function as input (output) terminals in one operation mode but at a predetermined voltage value region higher or lower than the normal logical voltage value region (hereinafter this predetermined voltage value region being called "a third value") they may function as control terminals in such manner that they inhibit the one operation mode and at the same time activate another operation mode.

According to still another feature of the present invention, in the above-featured monolithic digital integrated circuit, the operation modes include at least one test operation mode besides the normal operation modes, and the former is used for logic debugging or fault diagnosis.

According to yet another feature of the present invention, in the above-described monolithic digital integrated circuit, one or more groups of flip-flops are included, and each flip-flop group achieves a flip-flop operation in response to one or more clock inputs in the normal operation mode, but operates as a shift register in response to clock inputs applied to the same clock input terminals in the test operation mode.

According to a still further feature of the present invention, there is provided a monolithic digital integrated circuit including, as a part of its logic construction, one or more assemblies of programmable AND logic terms ("AND array"), one or more assemblies of programmable OR logic terms ("OR array"), or one or more OR arrays driven by one or more AND arrays, that is, the so-called programmable logic arrays (PLA), which comprises in the test operation mode, a selection circuit including a shift register that acts on the AND array or OR array so as to selectively activate one or a part of the respective AND terms or OR terms, that is, which has parallel outputs such that (1) all the AND (OR) terms other than the selected AND (OR) terms may be inactivated and the entire logic is operated only by the selected AND (OR) terms, and (2) the states of only the selected AND (OR) terms are transmitted to separately provided data output terminals, and in which at least a part of the various inputs, that is, all the activation inputs, shift operation clock inputs, shift in data and data outputs in the test operation mode of the selection circuit, uses the terminals in common with the inputs (outputs) in the other operation modes.

BRIEF DESCRIPTION OF THE DRAWINGS

These and other features and advantages of the invention will become apparent from the following detailed description of the preferred embodiments of the invention taken in conjunction with the accompanying drawings, in which.

DESCRIPTION OF THE PREFERRED EMBODIMENTS

Figure 1:
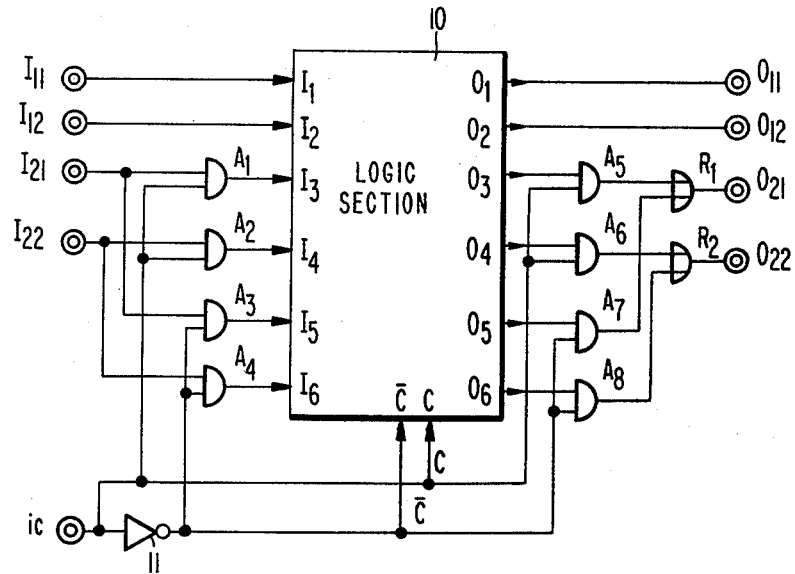
FIG. 1 is a block diagram showing an integrated circuit according to a first preferred embodiment of the present invention.

Now a first preferred embodiment of the present invention will be described with reference to FIG. 1. A logic section 10 in a semiconductor integrated circuit has six inputs $I_1$ to $I_6$ and six outputs $O_1$ to $O_6$, and is controlled by mutually complementary mode control signals C and $\overline{C}$. The inputs $I_1$ and $I_2$ are inputs which are always necessary irrespective of an operation mode, and are directly fed through input terminals $I_{11}$ and $I_{12}$, respectively. The outputs $O_1$ and $O_2$ are likewise necessary to be always derived, and are directly derived through output terminals $O_{11}$ and $O_{12}$, respectively. The combination of inputs $I_3$ and $I_4$ and the combination of the inputs $I_5$ and $I_6$ are never used simultaneously but only either one combination or the other is used. The combination of the outputs $O_3$ and $O_4$ and the combination of the outputs $O_5$ and $O_6$ are also never used simultaneously but only either one combination or the other is used, and in the illustrated embodiment it is assumed that the combination of the outputs $O_3$ and $O_4$ is used jointly with the combination of the inputs $I_3$ and $I_4$, while the combination of the outputs $O_5$ and $O_6$ is used jointly with the combination of the inputs $I_5$ and $I_6$. The inputs $I_3$ to $I_6$ are applied via 2-input AND gates $A_1$ to $A_4$, respectively. To one input of each of the AND gates $A_1$ and $A_2$ is applied, as a gate signal, a first mode control signal C that is fed from a terminal 1C without modification. Whereas, to one input of each of the AND gates $A_3$ and $A_4$ is applied, as a gate signal, a second mode control signal $\overline{C}$ that is complementary to the signal C and is fed from the terminal 1C through an inverter 11. On the other hand, the outputs $O_3$ and $O_4$ are derived to output terminals $O_{21}$ and $O_{22}$, respectively, through AND gates $A_5$ and $A_6$ to which the first mode control signal C is inputted and through OR gates $R_1$ and $R_2$, respectively. Likewise, the outputs $O_5$ and $O_6$ are also derived to the output terminals $O_{21}$ and $O_{22}$, respectively, through AND gates $A_7$ and $A_8$ to which the second mode control signal $\overline{C}$ is inputted and through the OR gates $R_1$ and $R_2$, respectively. The logical integrated circuit according to the illustrated embodiment has two operation modes, in which one operation mode may be a normal operation mode, and the other operation mode may be a test mode.

More particularly, the first operation mode is the operation involving the inputs $I_1$, $I_2$, $I_3$ and $I_4$ and the outputs $O_1$, $O_2$, $O_3$ and $O_4$ which occurs in response to a higher level (logic "1" level) of the first mode control signal C, while the second operation mode is the operation involving the inputs $I_1$, $I_2$, $I_5$ and $I_6$ and the outputs $O_1$, $O_2$, $O_5$ and $O_6$ which occurs in response to a higher level of the second mode control signal $\overline{C}$. In these respective operation modes, the unnecessary inputs are fixed at logic "0" level by closing AND gates in the illustrated embodiment. As described above, according to this preferred embodiment, an integrated circuit provided with many functions, that is, many input-output logic functions in this case can be realized while reducing the number of terminals to a small number. It is to be noted that the numbers of the inputs, outputs and mode control inputs as well as the details of the mode switching logic are not limited to those of the above-described embodiment.

Figure 2:
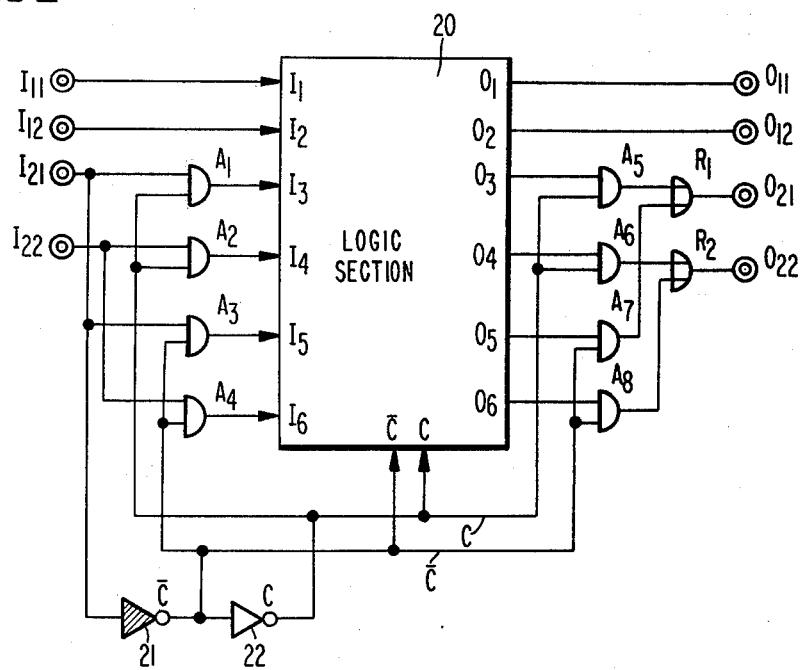
FIG. 2 is a block diagram showing an integrated circuit according to a second preferred embodiment of the present invention.
Figure 3:
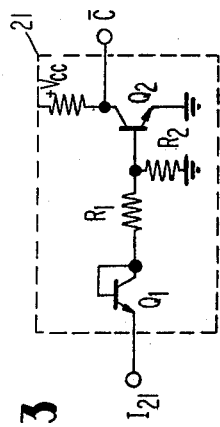
FIG. 3 is a circuit diagram showing an inverter to be used in the second preferred embodiment of the present invention.

Next, a second preferred embodiment of the present invention will be described with reference to FIGS. 2 and 3.

A logic circuit 20 has the same construction as that illustrated in FIG. 1, and input terminals $I_{11}$ and $I_{12}$ are directly coupled to inputs $I_1$ and $I_2$, respectively, while output terminals $O_{11}$ and $O_{12}$ are directly coupled to outputs $O_1$ and $O_2$, respectively. An input terminal $I_{21}$ is coupled to inputs $I_3$ and $I_5$, respectively, via AND gates $A_1$ and $A_3$. Likewise, an input terminal $I_{22}$ is coupled to inputs $I_4$ and $I_6$, respectively, via AND gates $A_2$ and $A_4$. On the other hand, outputs $O_3$ to $O_6$ are derived to output terminals $O_{21}$ and $O_{22}$ via AND gates $A_5$ to $A_8$ and OR gates $R_1$ and $R_2$. The above-mentioned construction is entirely similar to the first preferred embodiment. In this second preferred embodiment, a second mode control signal $\overline{C}$ is generated by an inverter 21 having a high threshold value (for example, 10 V) which is higher than the normal logic voltage region and coupled to the input terminal $I_{21}$, while a first mode control signal C is generated by inverting the second mode control signal $\overline{C}$ through an inverter 22, and these mode conrol signals C and $\overline{C}$ are applied to the circuit 20 and the respective AND gates. In this embodiment, when the terminal $I_{21}$ is within the normal logic voltage region (for instance, 0 to 5.5 V in the case of a TTL logic), the inverter 21 senses it as a lower level logic input (logic "0") and generates a higher level ("1") output $\overline{C}$, whereas when the terminal $I_{21}$ is at the third logic level (for instance, about 10 V), the inverter 21 senses it as a higher level logic input and generates a lower level output C. It will be readily understood without further explanation that these mode control signals $\overline{C}$ and C obtained as inverter outputs drive the respective AND gates exactly in the same manner as the first preferred embodiment and thereby can realize two operation modes. However, attention should be paid to the fact that in this preferred embodiment, when an input at the third level is applied to the input terminal $I_{21}$, that is, during the first operation mode, the input $I_3$ of the logic circuit 20 is always applied with a higher level of input signal. One preferred embodiment of the inverter 21 is illustrated in FIG. 3. This circuit includes transistors $Q_1$, $Q_2$ and resistors $R_1$ and $R_2$, and if the ratio of the resistance values $R_1/R_2$ is chosen at an appropriately small value, the transistor $Q_2$ is held OFF at the normal TTL level ("0" or "1") of OV to 5.5 V, but it will be turned ON when a voltage that is sufficiently larger than the Zener breakdown voltage of the transistor $Q_1$ (the third level input voltage) is applied to the input terminal $I_{21}$, and thereby a desired mode control output $\overline{C}$ can be obtained.

Figure 4:
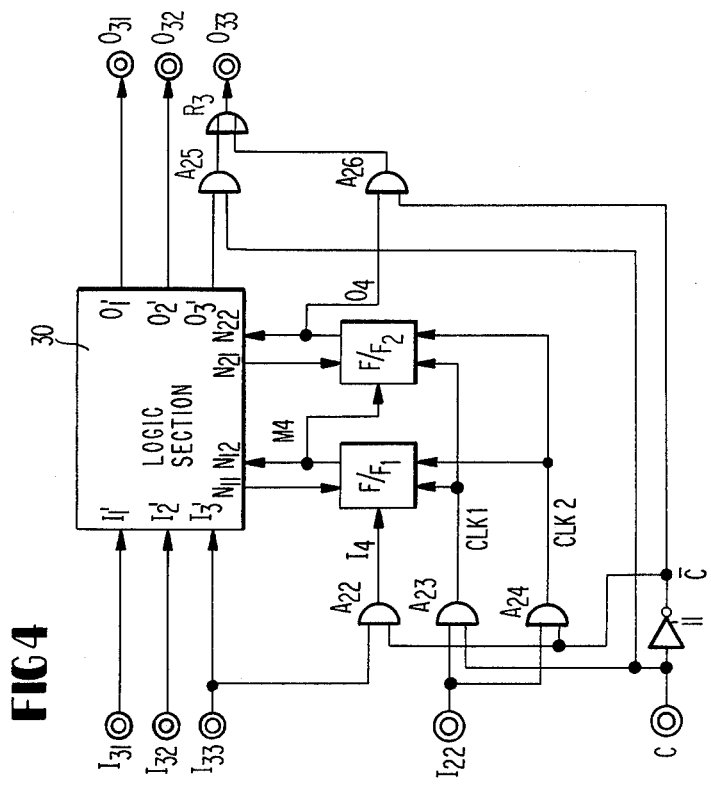
FIG. 4 is a block diagram showing an integrated circuit according to a third preferred embodiment of the present invention.

Now a third preferred embodiment of the present invention will be described with reference to FIG. 4. In this embodiment, let us consider the case where a general sequence circuit including flip-flops is divided into a series of flip-flop groups and another combinational logic section when a test is performed. In this case, as is well known, it is extremely desirable even for the purpose of mere testing of the system to arrange a part of or the whole series of flip-flop groups comprised therein so as to be operable as a shift register and to prepare inputs and outputs therefor, and this preferred embodiment uses this system. A logic section 30 including a combinational logic circuit comprises input $I_1'$, $I_2'$ and $I_3'$ coupled to input terminals $I_{31}$, $I_{32}$ and $I_{33}$, respectively, outputs $O_1'$ and $O_2'$ coupled to output terminals $O_{31}$ and $O_{32}$, respectively, and an output $O_3'$ coupled to an output terminal $O_{33}$ via AND gate $A_{25}$ and OR gate $R_3$. This logic section 30 may be, for example, a PLA including at least one of an AND array and an OR array having inputs $I_1'$ to $I_3'$, $N_{12}$ and $N_{22}$ and outputs $O_1'$ to $O_3'$, $N_{11}$ and $N_{21}$. Also the logic section 30 is coupled with a flip-flop $F/F_1$ through a write-output terminal $N_{11}$ which supplies the flip-flop $F/F_1$ with an information to be written therein and through a read-input terminal $N_{12}$ which supplies the logic section 30 with an information read-out from the flip-flop $F/F_1$. Similarly, the logic section 30 is coupled with a flip-flop $F/F_2$ through a write-output $N_{21}$ which supplies the flip-flop $F/F_2$ which supplies the logic section 30 with an information read-out from the flip-flop $F/F_2$. As the flip-flops $F/F_1$ and $F/F_2$, commonly used flip-flops such as those disclosed in FIG. 2 of U.S. Pat. No. 3,644,758 may be used. In this case, the flip-flop $F/F_1$ of the present invention may easily be realized by taking the input terminals 1 and 2 and clock terminals C1 and C2 of the above-cited flip-flop and respectively connecting them to the output $N_{11}$, the output 14, and the clocks 1 and 2 of the present invention, FIG. 4. The output 5 or 6 of the above-cited flip-flop may be coupled to the input end 12 of the present invention, FIG. 4. Similarly, the flip-flop $F/F_2$ of the present invention may easily be realized by taking the input terminals 1 and 2 and the clock terminals C1 and C2 of the cited flip-flop and respectively coupling them to the outputs $N_{21}$, $N_4$ and clocks 1 and 2 of the present invention, FIG. 4. Again, the output terminals 5 or 6 of the above-cited reference may simply be coupled to the input $M_{22}$ of FIG. 4.

In a normal operation mode, these flip-flops $F/F_1$ and $F/F_2$ are coupled with the logic section 30 through these inputs and outputs $N_{11}$ to $N_{22}$ and operate so as to define the state of the circuit 30. Wherein, an AND gate $A_{23}$ having one input coupled to a mode control signal terminal C and the other input coupled to a clock input terminal $I_{22}$ is opened to supply the flip-flops $F/F_1$ and $F/F_2$ with a clock signal CLK1 which makes the flip-flops $F/F_1$ and $F/F_2$ operate independently in parallel in response to the logic "1" level of the mode control signal supplied at the terminal C. While, in another operation mode, i.e. test mode, an AND gate $A_{24}$ having its inputs coupled to an output $\overline{C}$ of an inverter 11, an input of which is coupled to the mode control signal terminal C, and coupled to the clock terminal $I_{22}$ is opened to supply the flip-flop $F/F_1$ and $F/F_2$ with a clock signal CLK2 in response to the logic "1" level of the output $\overline{C}$. This clock signal CLK2 makes the flip-flops $F/F_1$ and $F/F_2$ operate as a shift-register. When this clock CLK2 is applied to the flip-flops $F/F_1$ and $F/F_2$ in response to a higher level ("1") of the signal $\overline{C}$, data applied to the input terminal $I_{33}$ is applied to the flip-flop $F/F_1$ as shift-in data $I_4$ via an AND gate $A_{22}$ to which the signal $\overline{C}$ is inputted, an output $M_4$ of this flip-flop $F/F_1$ is inputted to the flip-flop $F/F_2$ as an intermediate shift input, and an output of the flip-flop $F/F_2$ is derived as shift-out data $O_4$ at the output terminal $O_{33}$ via an AND gate $A_{26}$ to which the signal $\overline{C}$ is inputted and the OR gate $R_3$. Assuming now that the mode control terminal C is at a lower level, i.e. logic "0", and at the same time if a clock CLK2 for performing a shift operation of the flip-flop $F/F_1$ and $F/F_2$ is applied to the terminal $I_{22}$ and shift data are applied to the input terminal $I_{33}$, then both the AND gates $A_{22}$ and $A_{24}$ are opened, the AND gate $A_{26}$ in the output section is also opened, and thereby the two flip-flops $F/F_1$ and $F/F_2$ can perform a shift register operation. In this case, these flip-flops can be controlled so as to have their memory state forcibly and externally set, instead of operating as an internal state memory associated with the logic section 30. Accordingly, the inputs $N_{12}$ and $N_{22}$ for the logic section 30 can be controlled externally, and therefore, testing of the logic section 30 can be achieved. In the present embodiment, saving of terminals is achieved by utilizing the terminals $I_{33}$ and $O_{33}$ in common for the input $I'_3$ and output $O'_3$ and for the shift-in data $I_4$ and shift-out data $O_4$ respectively as well as the clock signal terminal $I_{22}$ for the clock signal CLK1 and for the clock signal CLK2.

Figure 5:
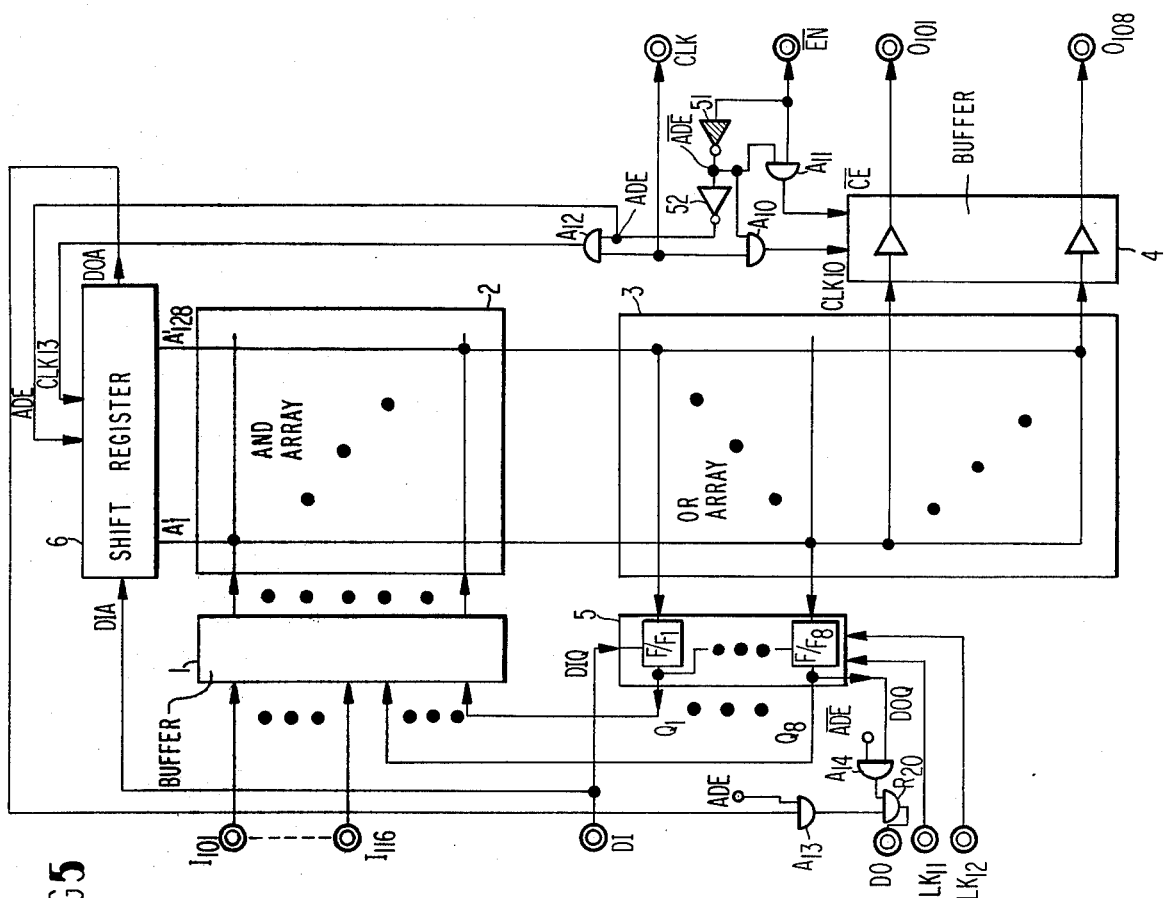
FIG. 5 is a block diagram showing a fourth preferred embodiment of the present invention.

Finally, a fourth preferred embodiment of the present invention will be described with reference to FIG. 5. In this preferred embodiment, the invention is described as applied to a programmable logic array, so-called PLA including an AND-OR array which is most popular as a combinational logic, and further, as the most appropriate example in the case of converting it to a sequential logic, we will consider the case where a part of an OR-array output is fed back to an AND-array input via flip-flops. Such a PLA is known, as disclosed in U.S. Pat. No. 3,958,110, for example.

An input buffer section 1 is inputted from input terminals $I_{101}$ to $I_{116}$ and from outputs $Q_1$ to $Q_8$ of a flip-flop section 5, and its outputs are inputted to an AND-array section 2. This AND-array section has AND term outputs $A'_1$ to $A'_{128}$, and these AND term outputs $A'_1$ to $A'_{128}$ are inputted to an OR-array section 3. A part of the outputs of the OR-array section 3 is inputted to the flip-flop section 5, and the other outputs are outputted to output terminals $0_{101}$ to $0_{108}$ via an output buffer section 4. The respective output terminals $A'_1$ to $A'_{128}$ of the aforementioned AND-array section 2 are forciby selected, that is, set at a higher level by the outputs of the shift register section 6 independently of the input condition. In the AND-array and OR-array, any arbitrary cross-points can be programmed as indicated by black dots. The black dot at the cross-point is practically realized by means of a transistor, diode, etc.

To the shift register section 6 is applied a data input DIA through a terminal DI, and an output DOA of the shift register section 6 is derived to an output terminal DO via an AND gate $A_{13}$ and an OR gate $R_{20}$. In this embodiment, the terminals DI and DO are commonly used as data input and output terminals, respectively, of the flip-flop section 5. To the shift register section 6 are also applied an enable signal $\overline{ADE}$ and a clock signal CLK13. An enable input terminal $\overline{EN}$ is coupled to inputs of an inverter 51 and an AND gate $A_{11}$, the other input of the AND gate $A_{11}$ is applied with an output $\overline{ADE}$ of the inverter 51, and the output of the AND gate $A_{11}$ is applied to the output buffer section 4 as its enable signal $\overline{CE}$. The signal $\overline{ADE}$ is applied to an input of an AND gate $A_{10}$ the other input of which is coupled to a clock terminal CLK, and the output of the AND gate $A_{10}$ is applied to the output buffer section 4 as a latch clock $CLK_{10}$. While, an output of an inverter 52 is applied to the shift register section 6 as an enable signal ADE, and also applied to an AND gate $A_{12}$ the output of which is applied to the shift register section 6 as a clock signal CLK13. The inverter 51 has a tresheld value at the third level (for example, 10V) apart from normal operation levels (for example, 0–5 V) and performs a logic operation with respect to this threshold value in the similar manner to the inverter illustrated in FIG. 3. Consequently, depending upon whether the enable input terminal $\overline{EN}$ is at the normal operation levels or at the third level, switching is performed between the normal operation mode and the mode in which the AND term selection operation in the shift register section 6 is activated. In the former mode, since the signal ADE is at a lower level ("0") and thus the clock signal CLK13 is blocked, the shift register section 6 is inactivated and the output buffer section 4 is enabled. While in the latter mode, the shift register section 6 is enabled. In this way, by means of the enable signal ADE, switching is effected between the output latch clock signal CLK10 and the shift clock signal CLK13 for the shift register section 6. As described above, in the logic integrated circuit constructed as shown in FIG. 5, what is as important as the controllability and observability of the condition of the flip-flop section 5 upon test debugging, is the controllability and observability of the respective terms in the AND-array 2 and OR-array 3, especially of the respective AND terms $A'_1$ to $A'_{128}$. While the former can be realized by the well-known shift register connection as described above, with regard to the latter the mode of activating the AND term selection circuit by the shift register section 6 is necessary, and it is possible to make the shift register section 6, which consists of 128 bits in the case described, forcibly select any arbitrary one of the AND terms by introducing data from the data input terminal DI under control of the terminals CLK and $\overline{EN}$. Then the observation of the output generated by the forcibly selected AND term can be achieved by means of the output terminals $O_{101}$ to $0_{108}$ by once returning the signal at the terminal $\overline{EN}$ to a signal having the normal logic amplitude and thereby operating the output buffer 4.

As described above, according to the present invention, the number of terminals of an extremely wide variety to monolithic logic integrated circuits can be reduced by appropriately utilizing an independent or third-level-responsive mode control input terminal $\overline{EN}$ and commonly using a plurality of input and output signal terminals depending upon use or non-use of input and output signals in the respective operation modes, and thereby effective utilization of the terminals can be achieved. Therefore, the effects of the present invention are extremely large.

It is to be noted that the present invention should not be limited to the above-described preferred embodiments but a wide scope of application thereof could be made.

I claim:

1. A digital integrated circuit including a logic section having an operation mode and a test mode of operation, said logic section comprising a plurality of inputs and a plurality of outputs and at least one mode control input, the logical function of said logic section being switched between said operation mode and said test mode by application of a control signal to said control input, said integrated circuit further including a plurality of input terminals fewer in number than the number of inputs to said logic section, a plurality of output terminals fewer in number than the number of outputs from said logic section, at least one pair of first AND gates having corresponding inputs connected in common with one of said input terminals and respective outputs connected to different ones of said logic section inputs, at least one pair of second AND gates having corresponding inputs respectively connected to different ones of said logic section outputs, an OR gate connected to logically combine the outputs of said at least one pair of second AND gates and supply the output to one of said output terminals, and an inverter connected to receive said control signal and provide an inverted control signal output, said control signal being provided as an input to one of the AND gates of each of said first and second pairs of AND gates while said inverted control signal from said inverter being provided as an input to the other one of the AND gates of said first and second pairs of AND gates.

2. A digital integrated circuit as recited in claim 1 further comprising a control terminal to which said control signal is applied, said control terminal being connected to said control input of said logic section and to the input of said inverter.

3. A digital integrated circuit as recited in claim 1 further comprising a second inverter having its input connected to one of said input terminals and its output connected to the input of the first mentioned inverter, said second inverter being nonresponsive to the normal logic mode voltage range but being responsive to the voltage outside the normal logic mode voltage range to generate said control signal.

4. A digital integrated circuit including a logic section comprising a plurality of inputs and a plurality of outputs, at least two flip-flops each of which is connected to respective inputs and outputs of said logic section to provide write inputs and read outputs, respectively, for said logic section in a normal mode of operation, a plurality of input terminals connected to the remaining inputs of said logic section and a plurality of output terminals connected to at least some of the remaining outputs of said logic section, first and second AND gates havng corresponding inputs respectively connected to one of said remaining outputs of said logic section and to one of the outputs connected to one of said two flip-flops, an OR gate connected to logically combine the outputs of said first and second AND gates and supply the output to one of said output terminals, a third AND gate having an input connected to one of said input terminals and an output connected to an input of a first one of said two flip-flops, an output of said first one of said two flip-flops being connected to a second one of said two flip-flops to form a shift register connection, clock means responsive to a control signal for switching the mode of operation of said two flip-flops between an operation mode in which said two flip-flops operate independently of one another and a test mode in which said two flip-flops operate as a shift register to sequentially apply a data signal supplied at the output of said third AND gate to inputs of said logic section, a control terminal to which said control signal is applied and an inverter connected to said control terminal to receive said control signal and provide an inverted control signal output, said control signal being provided as an input to said first AND gate while said inverted control signal from said inverter being provided to an input of each of said second and third AND gates.

5. A digital integrated circuit as recited in claim 4 wherein said logic section is a programmable logic array.

6. A digital integrated circuit including a programmable logic array having an AND-array, an OR-array and a plurality of flip-flops, the outputs of said AND-array being connected to inputs of said OR-array, at least part of the outputs of said OR-array being connected to said plurality of flip-flops and fed back to a part of the inputs of said AND-array, a plurality of input terminals connected to inputs of said AND-array and a plurality of output terminals connected to outputs of said OR-array, a shift register having a serial data input, a serial data output and a plurality of parallel outputs, said parallel outputs being connected to said AND-array to forcibly select outputs of said AND-array, a data input terminal connected to said serial data input of said shift register, a data output terminal, first and second AND gates having corresponding inputs respectively connected to the serial data output of said shift register and to an output of one of said plurality of flip-flops, an OR gate connected to logically combine the outputs of said first and second AND gates and supply the output to said data output terminal, clock means responsive to a control signal for switching the mode of operation of said programmable logic array between an operation mode and a test mode, said clock means supplying clock pulses to said shift register in said test mode, and an inverter connected to receive said control signal and provide an inverted control output, said control signal being provided as an input to said first AND gate while said inverted control signal from said inverter being provided to said second AND gate.

7. A digital integrated circuit as recited in claim 6 further comprising a control terminal to which said control signal is applied, a second inverter having its input connected to said control terminal and its output connected to the input of said first mentioned inverter, said second inverter being nonresponsive to the normal logic mode voltage range but being responsive to a voltage outside the normal logic mode voltage range to generate said control signal.

8. A digital integrated circuit as recited in claim 6 or 7 further comprising an output buffer section connected between said output terminals and outputs of said OR-array and responsive to said control signal for blocking or passing output signals to said output terminals.

9. An integrated circuit comprising a logic section having a plurality of input points, a plurality of output points and a mode control point, a plurality of input terminals fewer in number than said input points, a plurality of output terminals fewer in number than said output points, a control terminal for receiving a control signal having first and second different levels, means for supplying said control signal to said mode control point, said logic section taking a first operation mode in response to said first level of said control signal and a second operation mode in response to said second level of said control signal, a first gate coupled between one of said input terminals and one of said input points, a second gate coupled between said one input terminal and another of said input points, a third gate coupled between one of said output terminals and one of said output points, a fourth gate coupled between said one output terminal and another of said output points, first means responsive to said first level of said control signal for enabling said first and third gates thereby to provide electrical paths between said one of said input terminals and said one of said input points and between said one of said output terminals and said one of said output points, and second means responsive to said second level of said control signal for enabling said second and fourth gates thereby to provide electrical paths between said one of said input terminals and said another of said input points and between said one of said output terminals and said another of said output points.

10. The circuit according to claim 9, in which said logic section includes an AND-array having a plurality of inputs, one of which is connected to said one of said input points, an OR-array having a plurality of outputs, one of which is connected to said one of said output points, and a shift register coupled to outputs of said AND-array, said shift register having an input coupled to said another of said input points and an output coupled to said another of said output points.

11. An integrated circuit comprising a logic section having first to fourth input points and first to fourth output points, first and second input terminals receiving input signals, said second input terminal further adapted to receive in addition to said input signal a control signal larger in magnitude than said input signal, first and second output terminals, a first gate coupled between said first input terminal and said first input point, a second gate coupled between said first input terminal and said second input point, a third gate coupled between said first output terminal and said first output point, a fourth gate coupled between said first output terminal and said second output point, detection means coupled to said second input terminals for producing a detection signal when said control signal is applied to said second input terminal, first means response to the presence of said detection signal for enabling said first gate and said third gate, and second means responsive to the absence of said detection signal for enabling said second gate and said fourth gate.

12. The circuit according to claim 11, further comprising a fifth gate coupled between said second input terminal and said third input point and third means responsive to the presence of said detection signal for disabling said fifth gate.

13. The circuit according to claim 12, further comprising fourth means responsive to the absence of said detection signal for having said logic section operated in a first operation mode, and fifth means responsive to the presence of said detection signal for having said logic section operated in a second operation mode different from said first operation mode.

14. The circuit according to claim 9 or 13, in which said first operation mode is a normal operation mode and said second operation mode is a test mode.

15. The circuit according to claim 11, in which said logic section includes an AND-array having a plurality of inputs, one of which is connected to said first input point, an OR-array having a plurality of outputs, one of which is connected to said first output point, and a shift register coupled to outputs of said AND-array, said shift register having an input coupled to said third input point and an output coupled to said third output points.

* * * * *